United States Patent
Hufgard et al.

[11] Patent Number: 6,060,969
[45] Date of Patent: May 9, 2000

[54] CONTACTLESS PROXIMITY SWITCH

[75] Inventors: Erich Hufgard, Regensburg; Jürgen Steinkirchner, Cham; Wolfgang Clemens, Puschendorf; Joachim Wecker, Röttenbach, all of Germany

[73] Assignee: Siemens Aktiengesellschaft, Munich, Germany

[21] Appl. No.: 09/138,346

[22] Filed: Aug. 21, 1998

[30] Foreign Application Priority Data

Aug. 21, 1997 [DE] Germany ............... 197 36 454

[51] Int. Cl.⁷ .................................................. H01H 9/00
[52] U.S. Cl. .................................. 335/207; 335/205
[58] Field of Search .................... 335/207, 205, 335/206, 179, 306

[56] References Cited

U.S. PATENT DOCUMENTS

| | | | |
|---|---|---|---|
| 4,241,337 | 12/1980 | Prada ................................... | 340/547 |
| 4,292,615 | 9/1981 | Ohashi ................................... | 335/205 |
| 4,295,118 | 10/1981 | Herr et al. ........................... | 338/32 H |
| 5,541,562 | 7/1996 | Fletcher et al. . | |
| 5,554,964 | 9/1996 | Jansseune ............................. | 335/207 |
| 5,578,977 | 11/1996 | Jansseune ............................. | 335/207 |
| 5,646,587 | 7/1997 | Miyazawa et al. . | |
| 5,673,314 | 9/1997 | Olkoski et al. ...................... | 379/433 |
| 5,698,090 | 12/1997 | Miyazawa ........................... | 307/116 |
| 5,698,909 | 12/1997 | Miyazawa . | |
| 5,801,529 | 9/1998 | Umemoto et al. ................. | 324/207.12 |
| 5,902,004 | 5/1999 | Waltz et al. ........................ | 296/146.9 |

FOREIGN PATENT DOCUMENTS

| | | |
|---|---|---|
| 2 477 807 | 9/1981 | France . |
| WO 96/34457 | 10/1996 | WIPO . |

OTHER PUBLICATIONS

"Sensoranwendung", Hanno Schaumburg, B.G. Teubner Stuttgart 1995, pp. 208–211 No Month (TTN).

"The magnetoresistive sensor", August Petersen, Electronic COmponents and Applications, vol. 8, No. 4, pp. 222–239 (No Date).

John R. Hines et al., New Life for Hall Effect Sensors, Machine design 57 (Oct., 1985) No. 23, Cleveland, Ohio, USA, pp. 83–87.

*Primary Examiner*—Lincoln Donovan
*Assistant Examiner*—Tuyen Nguyen
*Attorney, Agent, or Firm*—Herbert L. Lerner; Laurence A. Greenberg; Werner H. Stemer

[57] ABSTRACT

The contactless proximity switch detects one or more predefined spacing distances between a first part and a second part. The two parts are movably disposed relative to one another. A magnetic angle sensor is disposed in or on the first part and a driver magnet with a driving magnetic field is arranged in or on the second part. When the two parts are at the predefined spacing between then the driving magnetic field produces in the angle sensor an effective direction of field lines which differs from the direction of the original state field lines of the angle sensor. The original field direction is imposed on the angle sensor by a biasing magnetic field which originates either from the driver magnet or from a separate biasing magnet.

17 Claims, 4 Drawing Sheets

# 6,060,969

CONTACTLESS PROXIMITY SWITCH

BACKGROUND OF THE INVENTION

FIELD OF THE INVENTION

The invention relates to a contactless proximity switch for detecting at least one predefined spacing between a first part and a second part mounted in a fashion capable of movement with respect thereto.

Prior art contactless proximity switches based on magnetic sensors utilize a permanent magnet in a first part and a reed relay in a second part. When a specific spacing from the permanent magnet is reached, then the reed relay switches because of a change in magnetic flux density in the relay. The detection of a change in flux density by means of a reed relay is, however, very susceptible to interference with respect to external magnetic interference fields in the environment of the magnetic system, and with respect to vibrations.

A proximity switch with a magnetoresistive sensor that is capable of moving relative to a permanent magnet is known from August Petersen: "The Magnetoresistive Sensor"; Electronic Components and Applications, Vol. 8, No. 4, pp. 222–39, 235. It is necessary in that proximity switch, to select a very high switching level in order to reduce the interference susceptibility with respect to external magnetic interference fields.

SUMMARY OF THE INVENTION

It is accordingly an object of the invention to provide a contactless proximity switch, which overcomes the above-mentioned disadvantages of the prior art devices and methods of this general type and which is improved with regard to its interference susceptiblity, in particular with respect to external magnetic interference fields and with respect to vibrations.

With the foregoing and other objects in view there is provided, in accordance with the invention, a contactless proximity switch for detecting a predefined spacing distance between a first part and a second part movably disposed relative to one another, comprising:

a first part carrying a magnetic angle sensor with a sensor output signal dependent on a direction of a magnetic field acting on the angle sensor;

a second part movably disposed relative to the first part and carrying a driver magnet with a driving magnetic field;

the angle sensor being subject to an original state field direction when the first and second parts are spaced from one another at a distance other than a predefined spacing distance, and the driving magnetic field effecting in the angle sensor a switching state field direction different from the original state field direction when the first and second parts are spaced from one another at the predefined spacing distance; and the magnetic angle sensor being subjected to a biasing magnetic field defining the original state field direction.

In other words, the magnetic angle sensor exhibits a sensor output signal dependent on the direction of a magnetic field acting on it. The driver magnet with a driving magnetic field is fastened to the second part in such a way that given the presence of the predefined spacing between the first and the second part, the driving magnetic field effects in the angle sensor a switching state field direction which differs from an original state field direction in the angle sensor which is present in the event of a spacing other than the predefined spacing between the first and the second part. The magnetic angle sensor is biased with a biasing magnetic field which defines the direction of the original state field lines.

A magnetic angle sensor is to be understood quite generally as a magnetic sensor having at least one electrical or other property which depends on the magnetic field direction inside the sensor and can be used as a sensor output signal. The magnetic field direction in the sensor is prescribed, for example, by means of an external magnet. The so-called GMR (Giant Magneto Resistor) sensor may be named as an example of a magnetic angle sensor; it has an electrical resistance depending on the magnetic field direction inside the sensor, and is explained in more detail in the international publication WO 94/15223, which is herewith incorporated by reference.

In accordance with an added feature of the invention, when the first and second parts are spaced from one another at a distance other than the predefined spacing distance, the angle sensor is disposed in a region of the driving magnetic field of the driving magnet in which a magnetic field direction thereof differs from the switching state field direction and the biasing magnetic field is generated by the driving magnet.

It is preferred when the direction of the driving field lines and the direction of the original state field lines run in an anti-parallel fashion relative to one another. As a result, a maximum change in the sensor signal is achieved when the spacing to be detected is reached, and thus upon transition from the direction of the original state field lines to the direction of the driving field lines. However, it is also possible, of course, to select any desired other angle not equal to 0° between two field directions. However, the smaller the angle the less is the change in sensor signal, and the higher must be the resolution of the sensor signal evaluation circuit employed.

In accordance with an additional feature of the invention, there is provided a biasing magnet in vicinity of the angle sensor which defines the direction of the original state field lines. Given the spacing to be detected between the first and the second part, the driving magnetic field and the biasing magnetic field are superimposed in the region of the angle sensor. The two magnetic fields are dimensioned such that in this position the driving magnetic field predominates in the angle sensor over the biasing magnetic field, and thus the effective direction of the field lines in the angle sensor corresponds to that of the driver magnet.

In accordance with a further feature of the invention, the first and second parts are parts of a mobile telephone including a speaker part and a lid (microphone part) pivotally supported on the speaker part. Folding the lid open or closed triggers the proximity switch and turns the mobile telephone on or off, respectively.

In accordance with again a further feature of the invention, the lid carries the driver magnet and the speaker part carries the magnetic angle sensor or, vice versa, the lid carries the magnetic angle sensor and the speaker part carries the driver magnet.

In accordance with again an additional feature of the invention, the first and second parts are parts of an automobile including a door frame and a door, and the magnetic angle sensor and the driver magnet are disposed and connected so as to trigger an interior illumination of the automobile.

In accordance with a concomitant feature of the invention, the first and second parts are parts of a refrigerator or a freezer with a door frame and a door, and the magnetic angle sensor and the driver magnet are disposed and connected so as to trigger an interior illumination of the refrigerator upon actuation of the door.

With the above and other objects in view there is also provided, in accordance with the invention, a contactless proximity switch, comprising:

magnetic angle sensor outputting a sensor output signal dependent on a direction of a magnetic field acting on the sensor;

the magnetic angle sensor being subjected to a biasing magnetic field defining an original state field direction thereof;

a driver magnet with a driving magnetic field movably disposed relative to the sensor such that:

when the angle sensor and the driver magnet are spaced from one another at a distance other than a predefined spacing distance, the angle sensor being subject to the original state field direction defined substantially exclusively by the biasing magnetic field; and when the angle sensor and the driver magnet are spaced from one another at the predefined spacing distance, the driving magnetic field effecting in the angle sensor a switching state field direction different from the original state field direction.

In summary, the direction of the field lines of the driving magnetic field and the direction of the original state field lines cause different sensor output signals in the magnetic angle sensor. The magnetic angle sensor therefore changes over from the original state into a switching state, given a satisfactory approach of the driver magnet. It is particularly preferred to use the GMR (Giant Magneto Resistor) sensor already named above as magnetic angle sensor in the case of the contactless proximity switch according to the invention.

In accordance with a concomitant feature of the invention, the driver magnet and the biasing magnet are permanent magnets. Alternatively, electromagnets may be used as well for either the driver magnet and/or the biasing magnet. This is attended by the advantage that the predefined spacing at which the magnetic angle sensor is to change over from the original state into the switching state can be changed by varying the magnetic field strength of the driver magnet or of the biasing magnet.

Other features which are considered as characteristic for the invention are set forth in the appended claims.

Although the invention is illustrated and described herein as embodied in a contactless proximity switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical and functionally identical components of the various exemplary embodiments are identified with the same reference symbols throughout the figures.

DESCRIPTION OF THE PREFERRED EMBODIMENTS

Figure 1:
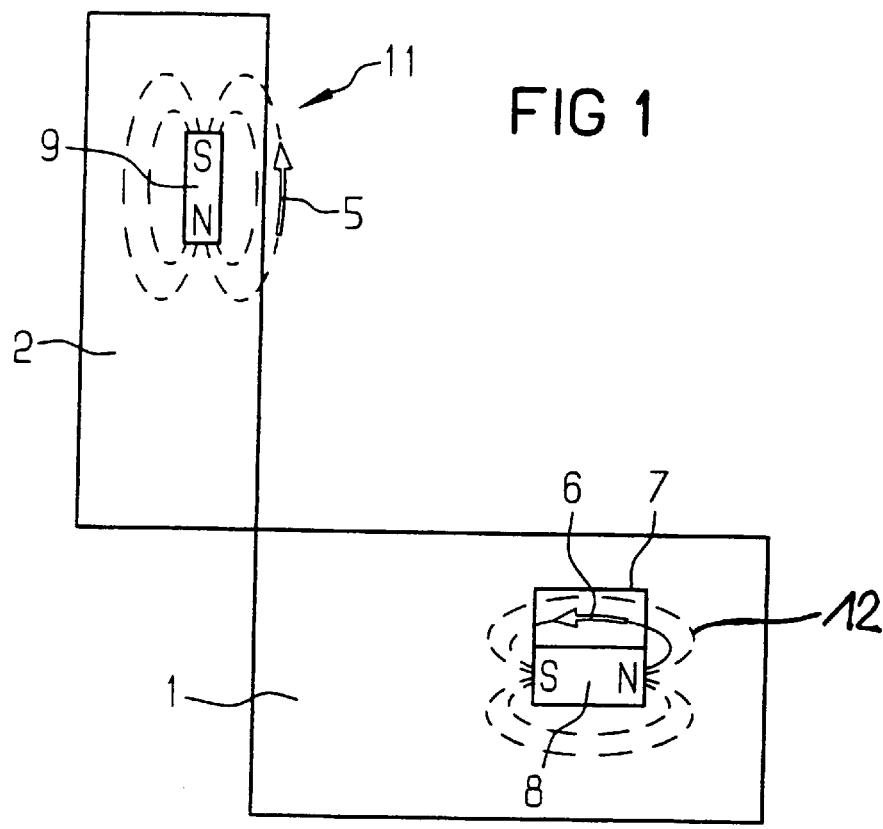
FIG. 1 is a schematic diagram of a first exemplary embodiment of the invention.

Referring now to the figures of the drawing in detail and first, particularly, to FIG. 1 thereof, there is seen a magnetic angle sensor 7 in the form of a magnetoresistor (for example a GMR) and, alongside the magnetoresistor, a biasing magnet 8. The two components are disposed in a housing 1, which may be, for instance, a housing of a mobile telephone set. A folding cover 2 is pivotally fastened to the housing 1. The cover 2, in the telephone example, would be a flip cover carrying a microphone of the telephone, that can be pivoted relative to the housing 1. Located in the folding cover 2 is a driver magnet 9 having a driving magnetic field 11 whose driving field direction 5 (switching state field direction) runs anti-parallel to an original state field direction 6 of the magnetic angle sensor 7. The driving field direction 5 and the original state field direction 6 can, however, also enclose any other desired angle not equal to 0° or 360°.

The original state field direction 6 of the magnetic angle sensor 7 is defined by the magnetic field of the biasing magnet 8.

When the driver magnet 9 approaches the magnetic angle sensor 7, the latter passes ever more deeply into the region of influence of the magnetic field of the driver magnet 9 and leaves its original state as a consequence of superimposition of the driving magnetic field on the biasing magnetic field. When the predetermined spacing between the housing 1 and the folding cover 2 is reached, for example with the folding cover 2 closed, then the direction of the field lines in the magnetic angle sensor 7 is rotated with respect to the direction 6 of the original state field lines. The rotation in the example would be by 180°. The angle sensor 7 therefore changes its electrical resistance (output signal) from the original state to a switching state. The change in the output signal is evaluated by a suitable evaluation circuit.

The driver magnet and the biasing magnet are, for example, permanent magnets or electromagnets.

Figure 2:
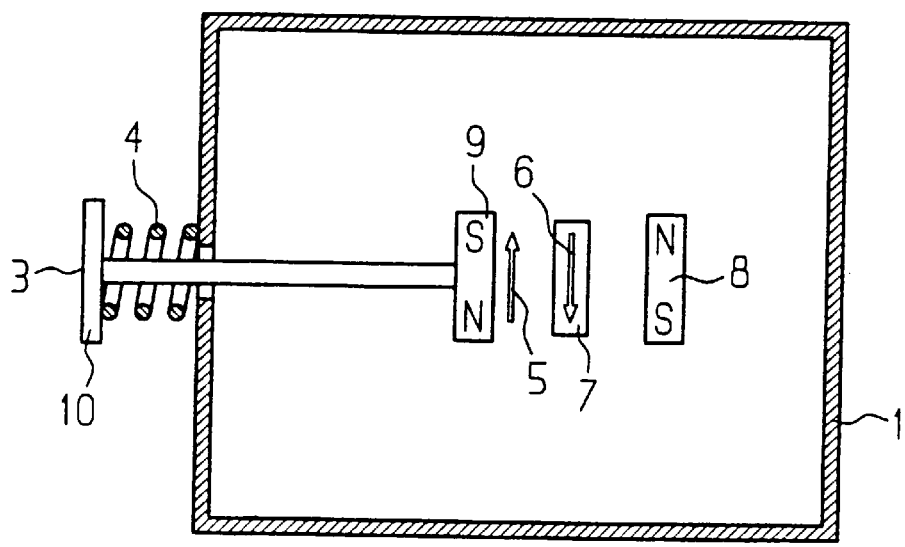
FIG. 2 is a partly sectional, diagrammatic view of a second exemplary embodiment.

The exemplary embodiment of FIG. 2 concerns a momentary-contact switch. A driver magnet 9 is fastened inside a housing 1 to a switch head or probe 3 which leads into the housing 1. An original position of the probe 3 (the repose position) is set up by means of a spring 4 outside the housing 1 between a contact plate 10 of the probe 3 and a housing outer wall. A magneto-resistor is disposed as the magnetic angle sensor 7 inside the housing 1. The original state of the sensor 7 is defined by a biasing magnet 8 disposed in its vicinity.

The magnetic field directions 5, 7 of the driver magnet 9 and of the biasing magnet 8 run anti-parallel relative to one another.

When the switch head 3 is pushed towards the housing 1 the spacing between the driver magnet 9 and the angle sensor 7 is reduced. The result is that the sensor is subjected ever more deeply to the influence of the magnetic field of the driver magnet 9, and its state is changed from the original state because of the superimposition of the driving magnetic field on the biasing magnetic field. This produces a change in the electrical resistance (output signal) of the magnetic angle sensor 7.

When a predetermined probe position is reached, that is to say a specific spacing between the housing 1 and the touch plate 10, then the direction of the field lines in the magnetic angle sensor 7 is rotated with respect to the direction 6 of the original state field lines by a value corresponding to this spacing, in the example by 180°. The angle sensor 7 then has electrical resistance (output signal) which is changed from the original state and corresponds to the switching state. The change in the output signal is evaluated by a suitable evaluation circuit.

Figure 3:
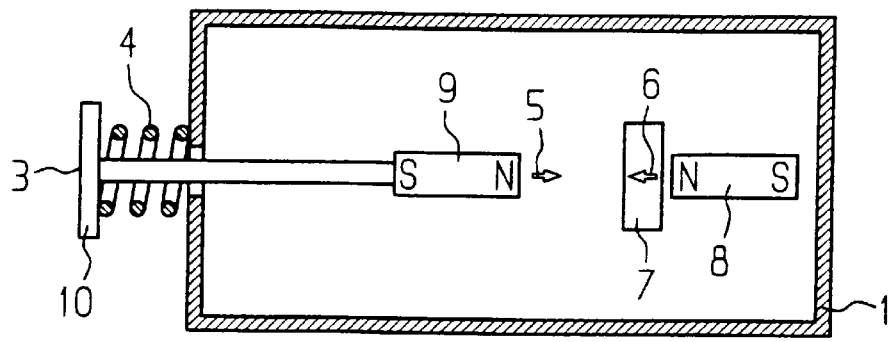
FIG. 3 is a similar view of a third exemplary embodiment.

The exemplary embodiment of FIG. 3 corresponds essentially to the one of FIG. 2, except that the driver magnet and the biasing magnet are rotated by 90° with respect to FIG. 2. The mode of operation of this exemplary embodiment is otherwise similar.

Figure 4:
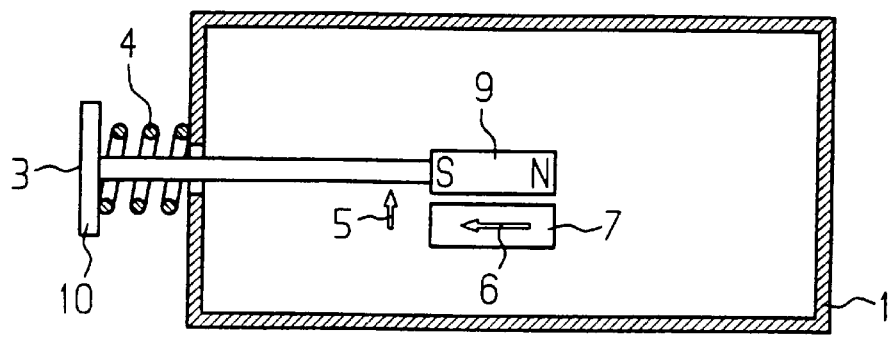
FIG. 4 is a similar view of a fourth exemplary embodiment.

The exemplary embodiment of FIG. 4 likewise concerns a momentary-contact switch that essentially corresponds to the second exemplary embodiment. By contrast with the latter, no biasing magnet is provided here. The original state of the magnetic angle sensor 7, the latter being present with the probe in its position of repose, is here defined by the driver magnet 9, which is displaced parallel relative to a movement axis on which the driver magnet 9 moves as the probe 3 is pressed. With the probe 3 not pressed, that is to say in the original state, the angle sensor 7 is located exactly below the driver magnet 9, whose magnetic field runs horizontally in the interior thereof. The original state field direction 6 in the angle sensor 7 therefore likewise runs horizontally.

When the switch head 3 is depressed (towards the housing), then the driver magnet 9 is pushed beyond the angle sensor 7, with the result that the angle sensor 7 passes into the region of the vertically aligned driving field direction 5 parallel to the end face of the driver magnet 9. The direction 5, of course, is rotated by 90° with respect to the original state field direction 6. As a result, the electrical resistance of the sensor changes relative to the original state, with the switch head 3 depressed.

Figure 5:
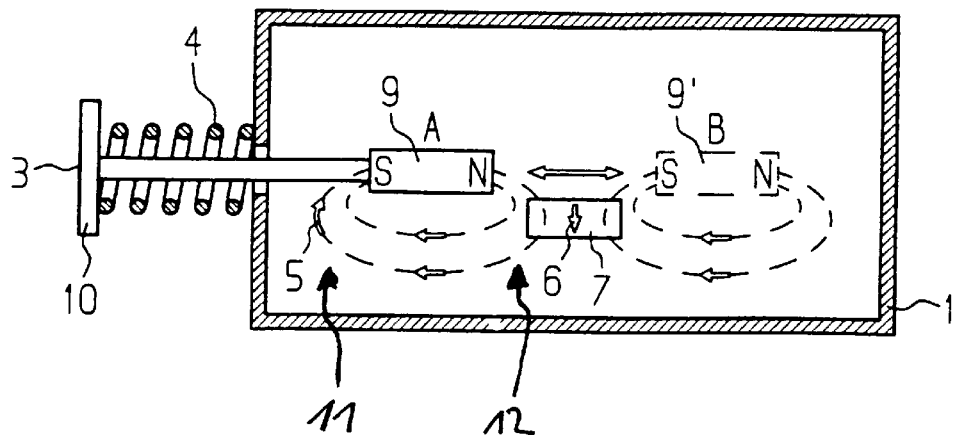
FIG. 5 is a similar view of a fifth exemplary embodiment.

The concept employed in the exemplary embodiment represented in FIG. 5 corresponds essentially to that of the momentary-contact switch of FIG. 4. By contrast, however, the driver magnet 9 is here located in front of the angle sensor 7 in the rest position of the probe 3 (original state), seen from the touch plate 10, and is located behind the angle sensor 7 when the probe 3 is pressed. The solid line represents the magnet 9 in the original position (A) and the dashed line represents the magnet 9' in the switched position (B). Consequently, the driver magnet 7 is pushed past the angle sensor 7 as the probe 3 is being pressed, and so the field direction in the angle sensor 7 is rotated by a total of 180° and a maximum change is produced in the resistance of the angle sensor 7.

Figure 6:
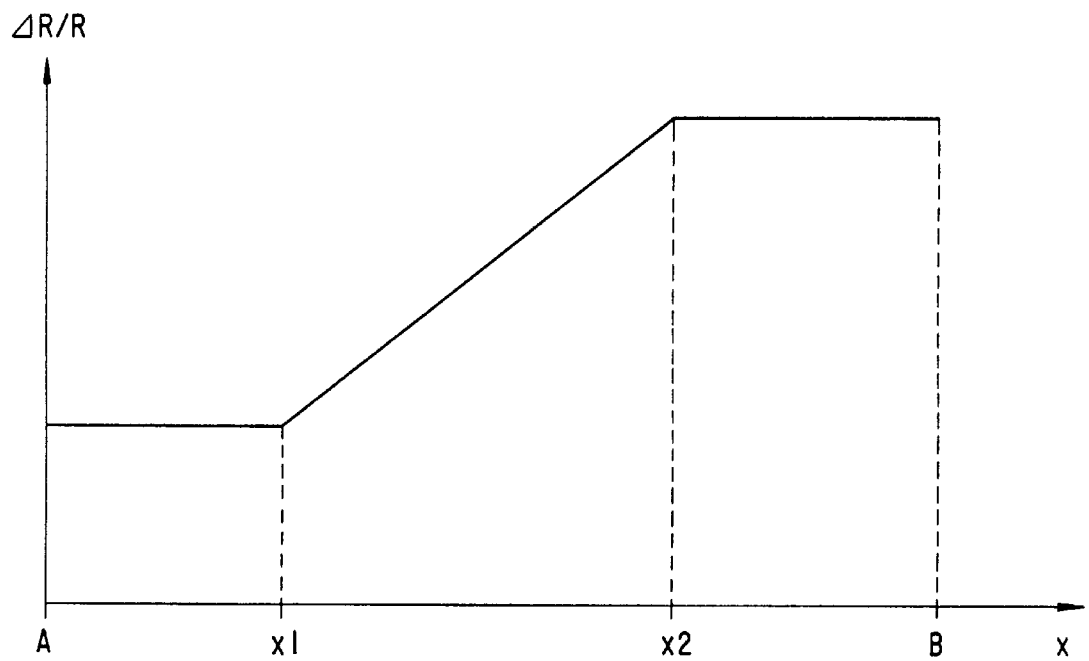
FIG. 6 is a diagrammatic graph of an exemplary characteristic of a sensor output signal.

A possible change in the signal as the driver magnet 9 is guided past the angle sensor 7 (movement from position A to position B) is represented schematically in the diagram of FIG. 6. A displacement path x is plotted on the horizontal axis, and the ratio ΔR/R is plotted on the vertical axis. The value R is the electrical resistance of the angle sensor 7. During the movement of the driver magnet 9 from A to B, ΔR/R is first constant until the magnetic field direction starts to change in the angle sensor at a point x1. From there, the ratio increases continuously as the magnetic field direction rotates in the angle sensor 7 and reaches a maximum value at a point x2, at which the magnetic field direction in the angle sensor 7 is rotated by 180°. Switching points of the momentary-contact switch can be selected by means of adapting the signal evaluation circuit for the angle sensor 7 at arbitrary mutually differing points in the rising area of the curve between x1 and x2. As a result, it is possible, for example, to vary the sensitivity of the momentary-contact switch in a simple way. The exemplary embodiments of FIGS. 1 to 4 have similar signal characteristics.

The proximity switch according to the invention can advantageously be used to detect not only a single, but also several spacing distances between the first and the second part. All that is required is that a given spacing value (spacing distance) be uniquely associated with a given ΔR/R.

In the exemplary embodiments explained with FIG. 4 and 5, it is not necessary, if a GMR sensor is used as the angle sensor 7, for example, for the latter to be located permanently in the region of influence of the driving magnetic field in the original state or in the switching state. A GMR sensor maintains its direction of magnetization in the measuring layer until the next magnetic reversal caused by an external magnetic field takes place.

Figure 7:
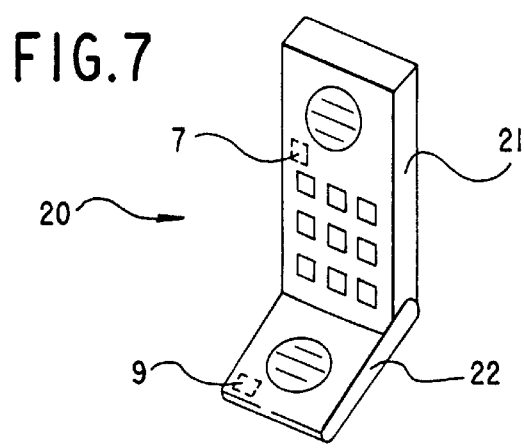
FIG. 7 is a perspective view of a mobile telephone set with a proximity switch according to the invention.

The contactless proximity switch is preferably used in a mobile telephone 20 (FIG. 7) with a microphone part 22 or a simple flip phone lid, which can be folded away from a loudspeaker part 21. As the flip cover 22 is opened or closed, the phone 20 may be simultaneously switched on or off, respectively. In this case the microphone part 22 or the loudspeaker part 21 has the driver magnet 9 and the loudspeaker part 21 or the microphone part 22 has the magnetic angle sensor 7.

Figure 8:
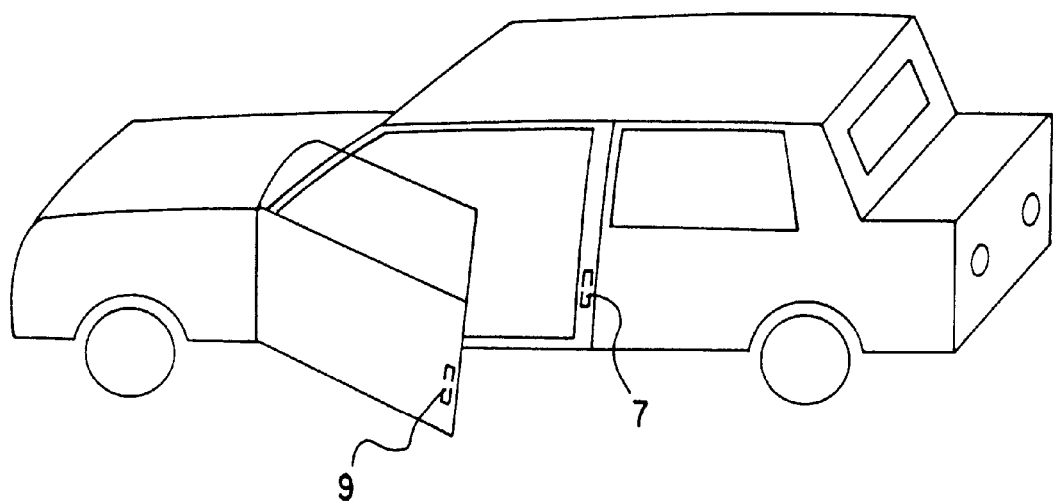
FIG. 8 is a perspective view of an automobile with a door sensor proximity switch according to the invention.
Figure 9:
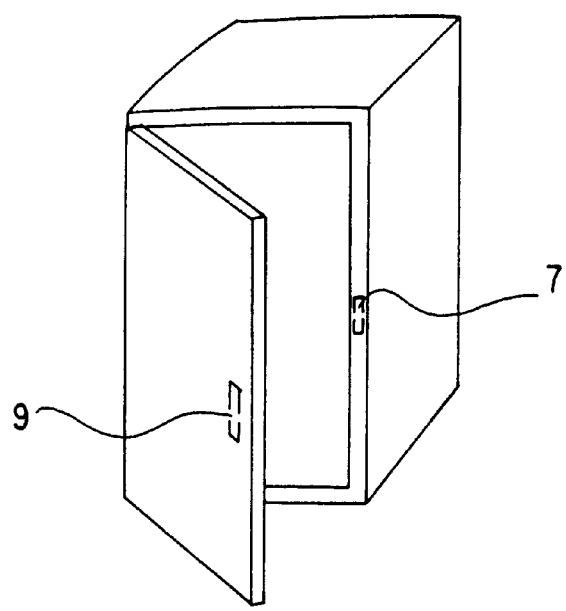
FIG. 9 is a perspective view of a refrigerator or freezer with a proximity switch in accordance with the invention.

Likewise, the proximity switch can advantageously be used as a door switch for the interior illumination in motor vehicles (FIG. 8) or in refrigerators or freezers (FIG. 9).

It goes without saying that the invention is not limited to the exemplary embodiments described above. However, it can be generally applied ubiquitously wherever the aim is to detect the approach of a first part towards or away from a second part.

We claim:

1. A contactless proximity switch for detecting a predefined spacing distance between a first part and a second part movably disposed relative to one another, comprising:
    a first part carrying a magnetic angle sensor for sensing a magnetic field direction and supplying a sensor output signal dependent on a direction of the magnetic field acting on said angle sensor;
    a second part movably disposed relative to said first part and carrying a driver magnet generating a driving magnetic field;
    said angle sensor being subject to an original state field direction when said first and second parts are spaced from one another at a distance other than a predefined spacing distance, and the driving magnetic field effecting in said angle sensor a switching state field direction different from the original state field direction when said first and second parts are spaced from one another at the predefined spacing distance; and
    said angle sensor being subjected to a biasing magnetic field defining the original state field direction.

2. The contactless proximity switch according to claim 1, wherein, when said first and second parts are spaced from one another at a distance other than the predefined spacing distance, said angle sensor is disposed in a region of the driving magnetic field of said driving magnet in which a magnetic field direction thereof differs from the switching state field direction and said biasing magnetic field is generated by said driving magnet.

3. The contactless proximity switch according to claim 1, which further comprises a biasing magnet defining the original state field direction.

4. The contactless proximity switch according to claim 1, wherein the original state field direction runs anti-parallel to the switching state field direction.

5. The contactless proximity switch according to claim 1, wherein the magnetic angle sensor is a GMR sensor.

6. The contactless proximity switch according to claim 1, wherein the driver magnet is one of a permanent magnet and an electromagnet.

7. The contactless proximity switch according to claim 3, wherein the biasing magnet is one of a permanent magnet and an electromagnet.

8. The contactless proximity switch according to claim 1, wherein the driver magnet is one of a permanent magnet and an electromagnet.

9. The contactless proximity switch according to claim 1, wherein said first and second parts are parts of a mobile telephone including a speaker part and a lid pivotally supported on said speaker part, wherein folding the lid open or closed triggers the proximity switch and turns the mobile telephone on or off, respectively.

10. The contactless proximity switch according to claim 9, wherein said lid carries said driver magnet and said speaker part carries said magnetic angle sensor.

11. The contactless proximity switch according to claim 9, wherein said lid carries said magnetic angle sensor and said speaker part carries said driver magnet.

12. The contactless proximity switch according to claim 9, wherein said lid is a microphone part of said mobile telephone.

13. The contactless proximity switch according to claim 1, wherein said first and second parts are parts of an automobile including a door frame and a door, and said magnetic angle sensor and said driver magnet are disposed and connected so as to trigger an interior illumination of the automobile.

14. The contactless proximity switch according to claim 1, wherein said first and second parts are parts of a refrigerator including a door frame and a door, and said magnetic angle sensor and said driver magnet are disposed and connected so as to trigger an interior illumination of the refrigerator.

15. The contactless proximity switch according to claim 1, wherein said first and second parts are parts of a freezer including a door frame and a door, and said magnetic angle sensor and said driver magnet are disposed and connected so as to trigger an interior illumination of the freezer.

16. A contactless proximity switch, comprising:

a magnetic angle sensor outputting a sensor output signal dependent on a direction of a magnetic field acting on said angle sensor;

said angle sensor being subjected to a biasing magnetic field defining an original state field direction thereof;

a driver magnet with a driving magnetic field movably disposed relative to said angle sensor such that:

when said angle sensor and said driver magnet are spaced from one another at a distance other than a predefined spacing distance, said angle sensor is subject to the original state field direction defined by the biasing magnetic field; and when said angle sensor and said driver magnet are spaced from one another at the predefined spacing distance, said driving magnetic field effects in said angle sensor a switching state field direction different from the original state field direction.

17. The contactless proximity switch according to claim 16, which further comprises a biasing magnet having the biasing magnetic field defining the original state field direction.

* * * * *